United States Patent [19]

Goth et al.

[11] Patent Number: 4,508,579

[45] Date of Patent: Apr. 2, 1985

[54] LATERAL DEVICE STRUCTURES USING SELF-ALIGNED FABRICATION TECHNIQUES

[75] Inventors: George R. Goth, Poughkeepsie; Shashi D. Malaviya, Fishkill, both of N.Y.

[73] Assignee: International Business Machines Corporation, Armonk, N.Y.

[21] Appl. No.: 248,918

[22] Filed: Mar. 30, 1981

[51] Int. Cl.³ .................... H01L 21/20; H01L 21/28
[52] U.S. Cl. ........................... 148/175; 29/578; 29/580; 148/187; 156/657; 156/662
[58] Field of Search ............ 148/175, 187; 29/578, 29/580; 156/657, 662

[56] References Cited

U.S. PATENT DOCUMENTS

| | | | |
|---|---|---|---|
| 3,677,837 | 7/1972 | Ashar | 148/175 |
| 3,919,005 | 11/1975 | Schinella et al. | 148/175 |
| 3,945,857 | 3/1976 | Schinella et al. | 148/1.5 |
| 4,047,975 | 9/1977 | Widmann | 148/1.5 |
| 4,054,895 | 10/1977 | Ham | 357/23 |
| 4,099,987 | 7/1978 | Jambotkar | 148/1.5 |
| 4,157,269 | 6/1979 | Ning et al. | 148/1.5 |
| 4,160,991 | 7/1979 | Anantha et al. | 357/49 |
| 4,254,428 | 3/1981 | Feth et al. | 148/187 X |
| 4,322,883 | 4/1982 | Abbas et al. | 148/187 X |
| 4,400,865 | 8/1983 | Goth et al. | 29/578 X |
| 4,415,371 | 11/1983 | Soclof | 148/187 X |

OTHER PUBLICATIONS

IBM TDB, vol. 19, No. 12, May 1977, "Method for Reducing the Emitter-Base Contact Distance in Bipolar Transistors", C. G. Jambotkar, pp. 4601–4604.
IBM TDB, vol. 21, No. 12, May 1979, "Stacking Poly-Silicon Devices for High Density LSI", I. T. Ho et al., pp. 4843–4844.

Primary Examiner—G. Ozaki
Attorney, Agent, or Firm—T. Rao Coca; John A. Jordan

[57] ABSTRACT

Submicron lateral device structures, such as bipolar transistors, Schottky Barrier diodes and resistors, are made using self-aligned fabrication techniques and conventional photolithography. The devices are made using individual submicron silicon protrusions which extend outwardly from and are integral with a silicon pedestal therefor. Both PNP and NPN transistors may be made by diffusing appropriate dopant material into opposing vertical walls of a protrusion so as to form the emitter and collector regions. The protrusions themselves are formed by anisotropically etching the silicon using submicron insulating studs as a mask. The studs are formed using sidewall technology where a vertical sidewall section of a layer of insulating material is residual to a reactive ion etching process employed to remove the layer of insulating material.

9 Claims, 14 Drawing Figures

LATERAL DEVICE STRUCTURES USING SELF-ALIGNED FABRICATION TECHNIQUES

BACKGROUND OF THE INVENTION

FIELD OF THE INVENTION

The present invention relates to integrated circuit device structures fabricated laterally in semiconductor material in a self-aligned manner and, more particularly, to complementary bipolar transistor, Schottky Barrier diode and resistor device structures laterally fabricated, in integrated form, in semiconductor material using self-aligned processing techniques.

CROSS REFERENCE TO RELATED APPLICATIONS

U.S. patent application Ser. No. 098,588 entitled "A Self-Aligned Micrometer Bipolar Transistor Device and Process" filed Nov. 29, 1979 by C. T. Horng et al, and assigned to the assignee of this application now U.S. Pat. No. 4,303,933.

U.S. patent application Ser. No. 133,155 entitled "A Polysilicon-Base Self-Aligned Bipolar Transistor Process and Structure" filed Mar. 24, 1980, by Ho et al, and assigned to the assignee of this application now Defensive Publication No. T104102.

U.S. patent application Ser. No. 79/01137 (filed as an international application) entitled "Method for Achieving Ideal Impurity Base Profile in a Transistor" filed Dec. 28, 1979, by B. L. Crowder et al, and assigned to the assignee of this application.

U.S. patent application Ser. No. 133,156 entitled "Method of Making High Performance Bipolar Transistor with Polysilicon Base Contacts" filed Mar. 24, 1980, by C. G. Jambotkar, and assigned to the assignee of this application now U.S. Pat. No. 4,319,932.

U.S. patent application Ser. No. 167,184 entitled "Self-Aligned Metal Process For Integrated Circuit Metallization" filed July 8, 1980, by Goth et al, and assigned to the assignee of this application now U.S. Pat. No. 4,400,865.

DESCRIPTION OF THE PROBLEM AND PRIOR ART

In order to increase the performance of electronic devices, such as transistor devices, extensive efforts have been made to develop fabrication processes which will result in smaller devices, spaced as closely as possible. Increased device density improves switching speed characteristics as well as wafer productivity.

In bipolar transistor devices, improvement in switching speed characteristics is sought, at least in part, by effecting a reduction in the base resistance, base-collector junction capacitance and collector-substrate capacitance. In addition, switching speed improvement is sought through minimization of collector-isolation capacitance and base-isolation capacitance. Efforts to reduce these parameters through reduction in device size have been confronted with a number of problems. In this regard, conventional photolithographic capability requires considerable allowance for registration (i.e., alignment) and etch tolerances. In addition, conventional processes employ a multiplicity of complex steps, each involving a discrete alignment requirement. The multiplicity of discrete steps requiring alignment compounds the problem by increasing the probability of defects and errors. Therefore, in order to minimize defects and errors, ground rules fashioned from tolerance constraints must be imposed upon fabrication processes; these constraints impede efforts to reduce size.

One technique employed in the prior art to reduce size and improve device yield is the so called "self-alignment technique". In the absence of such a technique, misalignment of, for example, the emitter region with respect to the base contact may result in variations in the extrinsic base resistance. In addition, this misalignment may also result in a higher $V_{BE}$ at one emitter edge than at the other. Thus, self-alignment not only aids in reduction of device size but also in improving device characteristics, reliability and yield.

Typical of the prior art schemes using self-alignment is that described by Ho et al in their article entitled "Stacking Poly-Silicon Devices for High Density LSI", published May 1979 in Vol. 21, No. 12 of the IBM Technical Disclosure Bulletin. Ho et al describe a bipolar process wherein polysilicon base contacts are used to self-align a polysilicon emitter contact, the latter being used as a source of impurity to form the emitter region. The polysilicon base and emitter contacts in Ho et al are separated by an oxide layer.

Likewise, U.S. Pat. No. 4,157,269 to Ning et al also describes the use of self-aligning polysilicon base contacts separated from the emitter contact by an oxide layer. However, the Ning et al process of forming the oxide sidewalls relies upon multiple masking layers and etching steps and undercutting techniques using wet etching.

An article entitled "Method for Reducing the Emitter-Base Contact Distance in Bipolar Transistors" by C. G. Jambotkar appearing in Vol. 19, No. 12, May 1977, of the IBM Technical Disclosure Bulletin describes two processes for reducing emitter-base contact distance using horizontal layers of insulation for separation therebetween and polysilicon as either base or emitter contact. However, because conventional process techniques are employed by Jambotkar to form insulation between emitter and base contact, the ability to achieve close spacing is limited. In similar manner, U.S. Pat. No. 4,160,991 to Anantha et al describes another typical arrangement aimed at reducing the spacing between emitter and polysilicon base contacts.

One of the difficulties with prior art efforts to reduce spacing between device contacts to achieve closer spacing and higher density resides in the fact that the processes rely upon conventional lithography to produce vertically-structured transistors which structure imposes physical limits on efforts to increase density. Vertical structure transistors fabricated via conventional lithography involve design features that inherently necessitate the use of multiple lithography units of semiconductor "real estate" to accommodate electrode displacement and device isolation. In addition, the vertical structure makes implementation of complementary transistor arrangements extremely difficult.

SUMMARY OF THE INVENTION

It is, therefore, an object of the present invention to provide improved integrated semiconductor devices.

It is a further object of the present invention to provide integrated semiconductor circuit devices, such as bipolar transistors, which are smaller in size and higher in performance.

It is yet a further object of the present invention to provide a method of making semiconductor devices which readily permits the integration of NPN transistors, PNP transistors, Schottky Barrier Diodes and resistors into semiconductor chips with a minimum of space.

It is yet still a further object of the present invention to produce high density integrated circuits with high yield and fewer process steps.

It is yet another object of the present invention to provide a process which produces laterally-structured electronic devices, such as bipolar transistors, in integrated form using conventional photolithography and self-alignment fabrication techniques.

In accordance with the principles of the present invention, improved bipolar transistor and electronic device density is achieved through fabrication of lateral device structures using self-aligning fabrication techniques and conventional photolithography.

Insulator sidewall techniques employing reactive ion etching of chemical vapor deposited films are used to precisely position a submicron stud on epitaxial (epi) silicon. The stud is used as a mask to permit reactive ion etching of the epi layer except for the narrow epi protrusion defined by and located under the stud. The narrow protrusion on the remaining epi pedestal provides the active region for device fabrication. The regions immediately adjacent opposing vertical surfaces of the protrusion provide self-aligned emitter and collector regions of a bipolar transistor arrangement with the base region being defined by the epi portion between these regions.

With the active device region extending above the epi plane, the requirement for isolation means between devices is eliminated. This latter improvement coupled with the minimum spacing between emitter and collector regions and the vertical ohmic contacts thereto provide a reduction in the overall space requirements of a device on a chip by an order of magnitude over the space required for conventional vertical transistor structures and processes for fabricating same.

DESCRIPTION OF THE PREFERRED EMBODIMENTS

Figure 1:
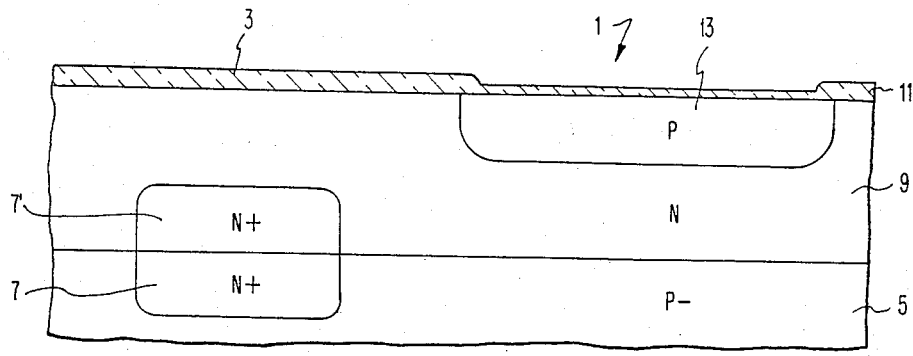
FIG. 1 shows a partial cross-sectional view of typical semiconductor structure used to fabricate lateral bipolar transistor, Schottky Barrier Diode and resistor devices, in accordance with the principles of the present invention.

With reference to FIG. 1, there is shown a partial section of a typical semiconductor structure used to fabricate lateral devices, in accordance with the present invention. In FIGS. 2-9 there is shown a series of cross-sectional views at various steps in the fabrication process employed, in accordance with the principles of the present invention, to make lateral NPN bipolar transistor structures. Although FIGS. 2-9 only depict, for the sake of simplicity, the manner in which lateral NPN bipolar transistors may be fabricated, it should be appreciated that in the manufacturing environment where diodes, resistors and complementary transistors are to be fabricated in integrated form, these various devices would be fabricated simultaneously in an integrated structure.

Thus with reference to FIG. 1, it should be understood that the right-hand portion of the structure, generally designated 1, is employed for the purpose of fabricating lateral NPN transistors and resistors. Conversely, the left-hand portion of FIG. 1, generally designated 3, is employed to fabricate lateral PNP transistors and Schottky barrier diodes. It should also be understood that the basic steps shown in FIGS. 2-9 to fabricate a lateral NPN device may also similarly be employed to fabricate PNP, Schottky Barrier Diode and resistor devices.

In fabricating lateral devices, in accordance with the principles of the present invention, the process commences with P− substrate 5 as shown in FIG. 1. The fabrication of lateral PNP transistors and Schottky barrier diodes requires that P− substrate 5 be doped N+ in conventional manner, as shown by reference character 7. The N+ doped region is employed, for example, as the 'subcollector' for the base of a lateral PNP transistor. As further shown in FIG. 1, epi layer 9 is grown upon substrate 5 using any of a variety of conventional techniques, such as chemical vapor deposition. Epi layer 9, which may be 2.0 to 3.0 μm, is then oxidized to form layer 11, typically 500 to 1,000 Å thick, upon its surface. P base region 13 is then formed by masking oxide layer 11 and etching same above region 13 to form an opening therein. Typically, reactive ion etching (RIE) may be employed for this purpose. A conventional P dopant material, such as boron, is then diffused or implanted into epi layer 9 to form P region 13. It should be appreciated that during the processing of the structure shown, N+ region 7 diffuses into epi layer 9 to form 7' region, as shown, in the epi layer. Oxide is formed over P region 13 either during or subsequent to its formation.

Figure 2:
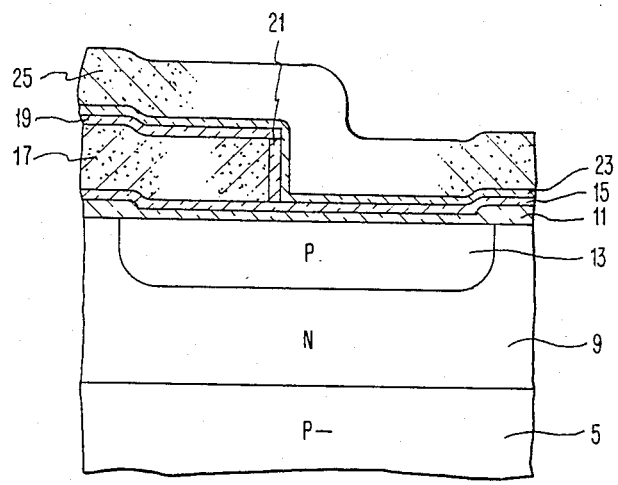
FIGS. 2-9 show partial cross-sectional views at the various steps in the fabrication process employed to make lateral NPN bipolar transistor structures, in accordance with the principles of the present invention.

After forming P region 13, oxide layer 11 is coated with a layer of silicon nitride 15, as shown in FIG. 2. This layer may be 300 to 1,000 Å thick. Thereafter, a layer of polysilicon 17 (0.5 to 1.5 μm thick) is deposited, e.g. by CVD, upon silicon nitride layer 15. A second layer of silicon nitride 19 (1,000 to 2,000 Å thick) is then deposited upon polysilicon layer 17. It should be appreciated that initially polysilicon layer 17 and silicon nitride layer 19 are deposited over the entire surface of the silicon substrate. The portion of silicon nitride layer 19 shown in FIG. 2 is then masked and the unmasked portion is etched, as, for example, by RIE in, for example, CF₄. The masked portion of silicon nitride layer 19 is then, in turn, employed as a mask for the underlying polysilicon 17. The unmasked portion of polysilicon 17 is, likewise, etched. Typically, RIE is used to etch polysilicon 17 in $SF_6+Cl_2$. However, it should be understood that other forms of etching may as readily be employed.

Again, with reference to FIG. 2, after the etching of polysilicon 17, the remaining vertical wall of the unetched portion is oxidized to form vertical oxide layer 21 typically between 500 and 1,000 Å thick. After forming vertical oxide layer 21, a third layer of silicon nitride 23 (300 to 1,000 Å thick) is deposited over the entire surface, in conformal fashion. Likewise, a second polysilicon layer 25 is deposited (0.4 μm to 1.2 μm thick) upon the third silicon nitride layer 23, in conformal fashion, by CVD, for example. The structure at this point is shown in FIG. 2.

Figure 3:
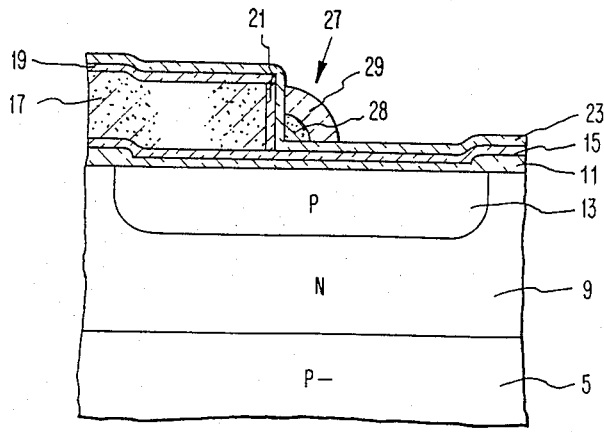
Figure 4:
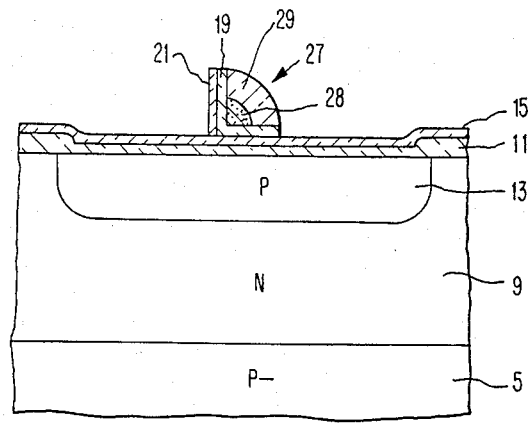

The submicron stud, using insulator sidewall techniques in accordance with the present invention, is next formed, as shown in FIG. 3, by anisotropic etching of polysilicon layer 25. Typically, this may be achieved by reactive ion etching the polysilicon in $SF_6+Cl_2$, or its equivalent, down to the third silicon nitride layer 23. The stud is shown by 27 as supported by the vertical portion of silicon nitride layer 23. After reactive ion etching polysilicon layer 25, the remaining stud portion 27 is oxidized to form oxide layer 29 (2,000 to 5,000 Å thick), as shown in FIG. 3. Obviously, it is better to completely oxidize the polysilicon stud 27 so that the polysilicon residue 28 is eliminated therefrom. High pressure oxidation tools may be used for this purpose. After forming the stud 27, conventional reactive ion and chemical etching techniques are employed to remove silicon nitride layers 23 and 19 and polysilicon layer 17. The structure at this point is shown by FIG. 4.

It should be understood that although stud 27 has been described as being formed by the anisotropic etching of polysilicon layer 25, an alternative approach may be employed whereby the oxidation step hereinabove employed to form vertical oxide layer 21 between 500 and 1,000 Å thick is extended so as to form a vertical oxide layer, say 8,000 Å thick. The unoxidized portion of polysilicon layer 17 is then etched away leaving a self-supporting stud of oxidized polysilicon material. High pressure oxidation may typically be employed for this purpose.

Figure 5:
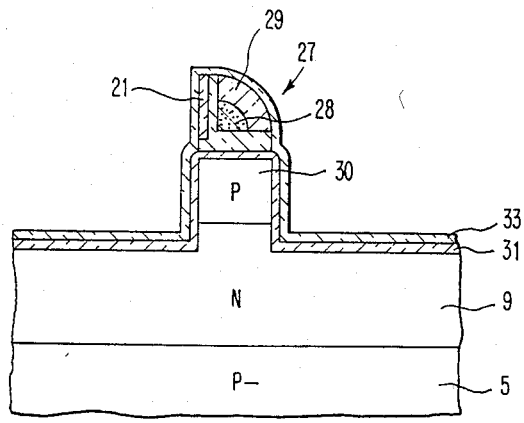

After silicon nitride layers 19 and 23 and polysilicon layer 17 have been removed to leave submicron stud 27, silicon nitride layer 15 is removed over all portions except that portion beneath stud 27. This, likewise, may be achieved by RIE. After removing silicon nitride layer 15, reactive ion etching is further employed to etch away (typically 1.0 μm) the epi layer over all portions except the portion beneath stud 27. In this regard, it can be seen that submicron stud 27 acts as a mask to transfer the submicron dimensions into the epi layer thereby defining a submicron silicon protrusion 30 on a silicon pedestal. This is shown in FIG. 5 and it can be seen that the width of silicon protrusion 30 is controlled by the CVD film thickness of polysilicon layer 25 and may be as narrow as 0.4 μm. As can be seen in FIG. 5, after etching epi silicon layer 9 using stud 27 as a mask, the surface of the epi silicon is reoxidized in conventional manner so as to form oxide layer 31 (500 to 1,000 Å thick) over the exposed epi silicon. Thereafter, a further layer of silicon nitride 33 (300 to 1,000 Å thick) is deposited over the entire structure including the stud portion 27. Typically, this latter silicon nitride layer may, as in previous instances, be deposited by CVD.

Figure 6:
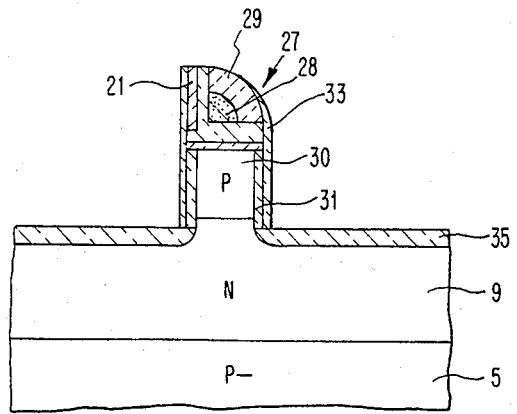

After deposition of silicon nitride layer 33, reactive ion etching is employed using, for example, $CF_4$ to remove the silicon nitride over all regions except the vertical walls of stud 27 and silicon protrusion 30. With the silicon nitride on the vertical walls of stud 27 and protrusion 30, reoxidation according to conventional techniques is then employed to form relatively thick oxide layer 35, as shown in FIG. 6. In this regard, oxide layer 35 may be anywhere between 2,000 and 5,000 Å thick.

Figure 7:
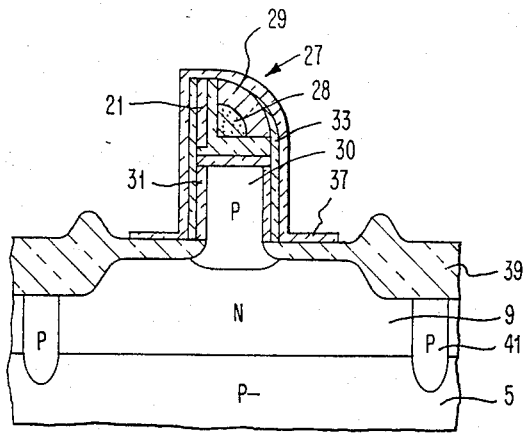

After forming oxide layer 35, yet a further layer of silicon nitride 37 is deposited over the entire structure in conformal fashion. After depositing silicon nitride layer 37, conventional masking techniques are employed to mask the portions of this layer covering, and adjacent to, stud 27 and protrusion 30. After covering these portions of layer 37, reactive ion etching is employed to remove the unmasked portions of the layer leaving the masked portions, as shown in FIG. 7.

With silicon nitride layer 37 acting as a mask, oxide layer 35 and epi silicon layer 9 are etched so that recessed oxide isolation layer 39 may be formed. Typically, the epi silicon may be etched 4,000 Å. After etching the epi silicon, the recessed oxide isolation (ROI) is grown with, for example, steam, to form the $SiO_2$ layer 39, as shown. Birds' beak free ROI may be used here, instead of the conventional ROI, to improve planarity. After forming ROI layer 39, a conventional isolation implant mask is employed to permit isolation implant P region 41 to be formed. In this regard, boron may be ion implanted at approximately 180 Kev. Typically, the mask employed for such an implant may be conventional photoresist. It should be appreciated that rather than grow the ROI first and then implant the P isolation regions, the P isolation regions may first be implanted and then the epi silicon layer 9 etched and ROI region 39 formed. Portions or nitride layer 37 are retained to prevent formation of ROI where reach through contacts to the substrate are required via the P+ diffusion 41. It should also be appreciated that with the heat cycles employed for the ROI oxidation the impurities in P base region 30 diffuse downward, as shown in FIG. 7.

Figure 8:
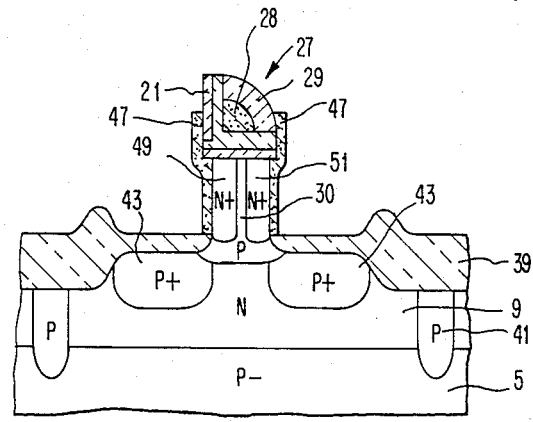
Figure 9:
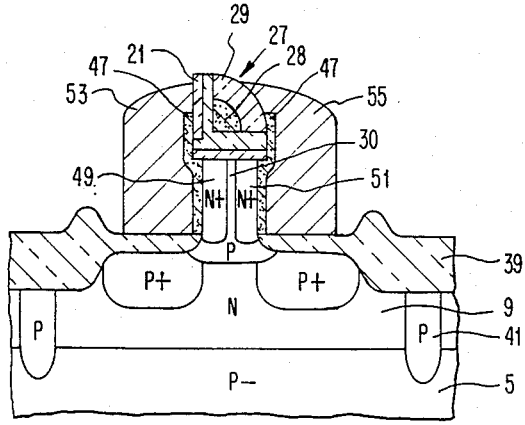

After forming ROI oxide 39 and isolation regions 41, the extrinsic base region 43 is formed. To form extrinsic P+ base region 43, a block-out mask, such as conventional photoresist, may be employed to block out all areas except a region around the stud 27, as shown in FIG. 8. Extrinsic base region 43 is then formed by ion implantation of boron ions at approximately 180 Kev. After forming the extrinsic base region, a photoresist mask is used to define the N+ collector and emitter regions 49 and 51 by chemical or plasma etch of the remaining nitride layers 33 and 37 over the vertical surfaces of the silicon protrusion, followed by chemical etch of the underlying oxide layer 31 to open windows for diffusing the N+ dopants for regions 49 and 51. Next, a polysilicon layer 47 is formed by blanket deposition of polysilicon (1,000 Å to 3,000 Å thick) and etching it away where not needed, as for example by using a photoresist mask and chemical or plasma etch, leaving a stripe of polysilicon over the silicon protrusion and stud.

The remaining layer 47 of polysilicon, covering the emitter and collector regions, is doped with an N+ dopant, such as arsenic, by using conventional diffusion techniques or by ion implantation (using about 30 to 200

Kev energy ions). A thin thermally grown screen oxide may be used prior to the ion implantation, or subsequent to it, to trap the dopants in the polysilicon. The arsenic is then driven into the single crystal silicon protrusion to the desired depth (e.g. 0.3 micron) by using an appropriate drive-in heat cycle at about 950° C., to form the emitter and collector regions 49 and 51. A blanket vertical RIE of the polysilicon 47 then cuts the same into two separate pieces, as shown in FIG. 8.

The emitter heat cycle is normally sufficient to link up the P-base region of protrusion 30 with the more heavily doped extrinsic base region 43. Otherwise, an appropriate heat cycle may be added, prior to the emitter heat cycle, to ensure such a link up. The heat cycles also make the P+ dopants electrically active as usual.

After formation of the emitter and collector regions 49 and 51, and separation of the polysilicon layer into the two parts labeled 47, a photoresist mask is used to define metal contact regions. Chemical, plasma or isotropic reactive ion etching may be used to remove the oxide layer (and nitride layer, if remaining) from such regions to expose the underlying silicon or polysilicon layers. A blanket deposition of platinum then follows, using conventional techniques, to form PtSi by sintering in usual fashion. Excess platinum is then etched out chemically, using conventional techniques, followed by deposition of metal in selected regions by using, for example, the lift-off technique, and separation of the collector metal from the emitter metal by planarization. As explained in the above-cited Goth et al application, planarization involves coating the substrate with a layer of planar photoresist or polyimide followed by RIE to expose the metal hump over the stud 27. Exposed metal humps are then etched to separate the collector and emitter metals.

Figure 13:
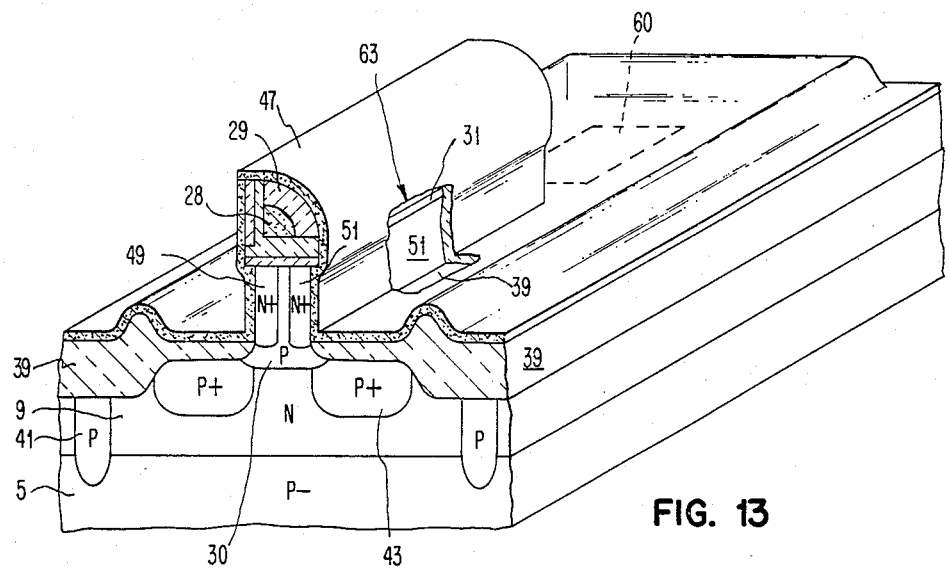
FIG. 13 shows one method of making contact to the emitter, base and collector regions of lateral transistors fabricated in accordance with the present invention.
Figure 14:
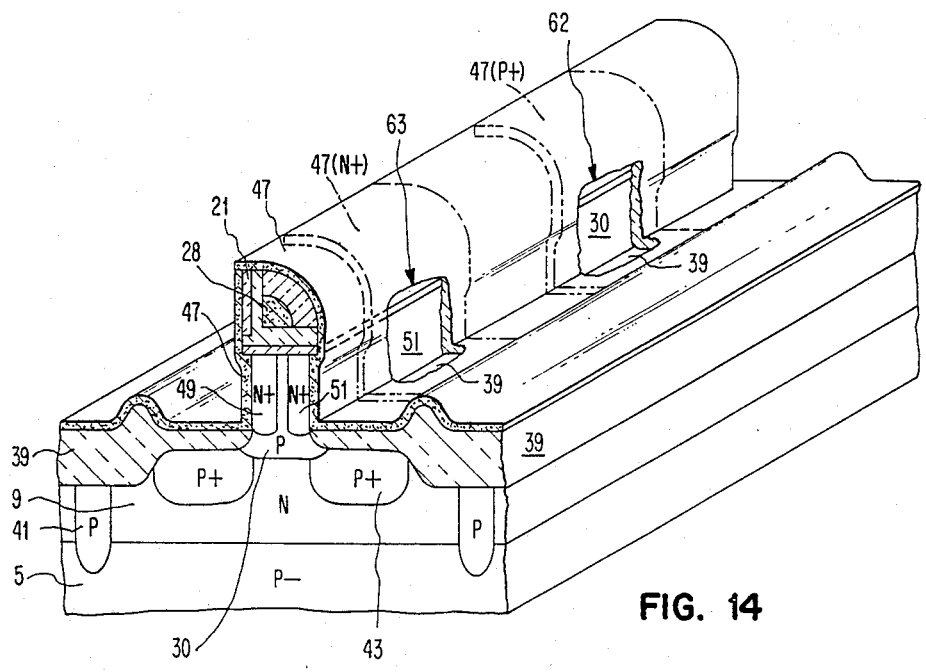
FIG. 14 shows an alternative method of making contact to the emitter, base and collector regions of lateral transistors fabricated in accordance with the present invention.

It should be appreciated that the base can be contacted by a horizontal contact to the surrounding P+ region 43, as shown in FIG. 13. Alternately, one may contact the base by a vertical contact, similar to the emitter and collector contacts, except that the polysilicon thereover is doped with P+ rather than N+, as shown in FIG. 14. Furthermore, the base contacts may be defined in the same manner, and along with the definition of the emitter and collector contacts, to simplify the process. The horizontal base contact region may then be covered with polysilicon layer 47, except that this polysilicon is doped with a P+ dopant.

Figure 10:
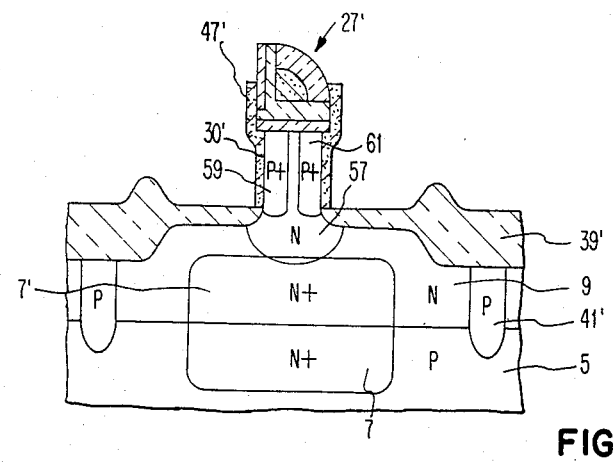
FIG. 10 shows a partial cross-sectional view of a lateral PNP bipolar transistor structure fabricated in the same epitaxial layer with the same basic steps as used in the process employed to fabricate the lateral NPN transistor structure shown in FIGS. 2-9.

In addition to forming NPN bipolar transistor devices, the basic steps employed in FIGS. 1-9 may be utilized to form PNP bipolar transistor devices, as shown in FIG. 10. As hereinabove mentioned, PNP bipolar transistor devices require the formation of an N+ region prior to the formation of the lateral transistor. To form the lateral PNP transistor, an N+ diffusion is first made into the epi region, akin to the manner in which the P region 13 was established, as shown in FIG. 1. The N+ region may be formed by any of a variety of conventional techniques. Typically, the N+ region, shown at 57 in FIG. 10, has an impurity concentration less than the N+ subcollector 7' but greater than the N epi layer 9. After formation of the N+ region 57, the same techniques as employed in FIGS. 1-7 are employed to form stud 27' and a silicon pedestal 30' thereunder. Likewise, the same techniques as employed in FIG. 7 to form ROI 39 and implant 41 are employed to form ROI 39' and P isolation region 41', shown in FIG. 10. It should be appreciated that the thermal cycles employed to form ROI layer 39' act to cause N+ region 57 to diffuse downwardly. In this regard, the thermal cycling is controlled to cause N+ region 57 to slightly diffuse into N+ region 7'. It is clear that P+ emitter and collector regions 59 and 61, respectively, may be formed through polysilicon layer 47' in the same manner that N+ emitter and collector regions 49 and 51, respectively, were formed in regard to the NPN transistor shown in FIG. 9. It can be seen that the steps employed to form the PNP transistor are essentially the same as those used to form the NPN transistor and conventional manufacturing processes. We can typically fabricate the devices together.

Figure 11:
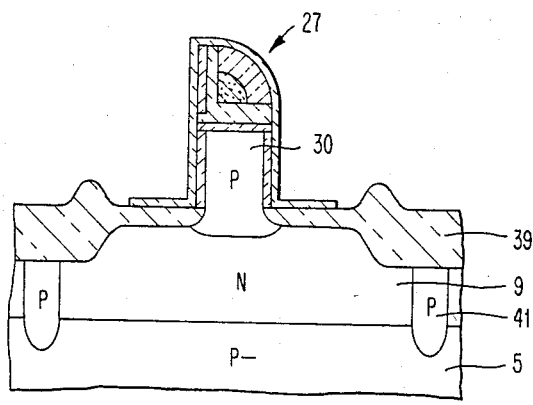
FIG. 11 shows a partial cross-sectional view of a resistor structure fabricated in the same epitaxial layer with the same basic steps as employed to fabricate the lateral NPN transistor structure shown in FIGS. 2-9.

In addition to forming lateral NPN and PNP bipolar transistors, the process, in accordance with the present invention, may be employed to form lateral resistors and Schottky Barrier diodes. In this regard, FIG. 11 shows a configuration which may be employed to form a lateral resistor. As is evident, the configuration shown at FIG. 11 is essentially the same as that shown at FIG. 7 prior to diffusion of the N+ emitter and collector regions 49 and 51, respectively. Resistor contacts in accordance with conventional masking and etching techniques may be employed to make contact with the P silicon protrusion 30 which is employed as the resistor device. As is clear to those skilled in the art, the value of the resistor may be varied in accordance with the P dopant level.

Figure 12:
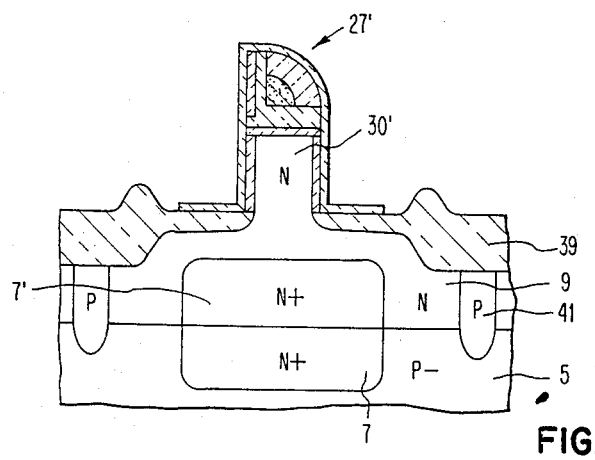
FIG. 12 shows a partial cross-sectional view of a Schottky barrier diode structure fabricated in the same epitaxial layer with the same basic steps as employed to fabricate the transistor structure shown in FIGS. 2-9.

Similarly, a Schottky Barrier diode may be fabricated using essentially the same steps as employed to form the lateral PNP transistor prior to the formation of the P+ emitter and collector regions 59 and 61, respectively. As shown in FIG. 12, the anode of the Schottky Barrier diode corresponds to the silicon protrusions 30' while the cathode corresponds to N+ region 7'. Again, conventional masking and etching techniques may readily be employed to make electrical contact to these regions to form the diode.

It will be appreciated that the base dopants in regions 30 and 30' for the NPN and PNP transistors, respectively, diffused initially from the top to form, for example, region 13, can also be introduced by diffusion from the vertical sides of the protrusion immediately after formation of the protrusion, or at any suitable step thereafter.

FIG. 13 shows a perspective view to illustrate the manner in which contacts may be made to the lateral NPN transistor device fabricated in accordance with the principles of the present invention. In this case, base contact is made by forming an opening in nitride layers 33/37 and oxide layer 35, as shown at 60. The manner in which emitter and collector contacts are made is shown via the cutaway 63 in the polysilicon layer 47 prior to layer 47 being etched.

In FIG. 14, the cutaway 62 shows the base contact being made vertical, like the emitter and collector contacts in FIG. 13. It is also evident that combinations of the base contact schemes may be employed, as well as other schemes within the skill of the artisan.

It should be understood that although reference above has been made to the use of silicon and those process materials compatible therewith in implementing the method and apparatus in accordance with the present invention, it is clear that other types of semiconductor material, such as GaAs, may as readily be employed along with any of a variety of process materials compatible therewith. Thus, while the invention has been particularly shown and described with reference to the preferred embodiment thereof, it will be understood by those skilled in the art that various changes in form and detail may be made therein without departing from the spirit and scope of the invention.

We claim:

1. A process for forming a semiconductor pedestal structure of tightly controlled width, comprising the steps of:

providing a body of semiconductive material;

providing a first insulating layer on said body of semiconductive material;

providing a first polysilicon layer over a first portion of said insulating layer leaving a second portion of said insulating layer exposed, said first polysilicon having a substantially vertical surface extending between said first and second portions;

providing a second insulating layer conformally over said first polysilicon layer including said vertical surface thereof and said exposed second portion of the first insulating layer, said second insulating layer over said vertical surface serving as a sidewall;

providing a second polysilicon layer conformally over said second insulating layer;

anisotropically etching said conformal second polysilicon layer forming a stud of said second polysilicon abutting said sidewall with the width of said polysilicon stud defined by the thickness of said conformal second polysilicon layer;

thermally oxidizing said polysilicon stud to convert said polysilicon stud into an essentially silicon dioxide stud;

removing said first polysilicon layer and the second insulating layer provided thereover to leave said oxide stud self-supporting and flanked on one side by said second insulating layer sidewall; and forming a protrusion of said semiconductive material on a pedestal thereof with the width of said protrusion defined by the width of said self-supporting stud by anisotropically etching said body of the semiconductive material surrounding said self-supporting stud using said self-supporting stud as a mask whereby a semiconductor pedestal structure of tightly controlled width is formed.

2. The process as set forth in claim 1 wherein said second insulating layer provided over said first polysilicon and said exposed second portion of the first insulating layer is composed of a layer of silicon nitride material and said second insulating layer provided over said vertical surface is composed of a dual layer of silicon dioxide-silicon nitride.

3. The process as set forth in claim 2 wherein said first insulating layer is a dual layer of silicon dioxide-silicon nitride material.

4. The process as set forth in claim 2 wherein said body of semiconductive material is composed of a layer of epitaxial silicon formed on a silicon substrate.

5. The process as set forth in claim 4 wherein the step of anisotropically etching said semiconductive material surrounding said stud comprises reactive ion etching the said epitaxial silicon surrounding said stud.

6. A process for forming a semiconductor pedestal structure of tightly controlled submicron width, comprising the steps of:

providing a layer of silicon semiconductive material;

forming a first insulating layer on said silicon semiconductive material;

forming a first polysilicon layer over a first portion of said first insulating layer leaving a second portion of said first insulating layer exposed, said first polysilicon having a substantially horizontal surface and a vertical wall surface extending between said first and second portions;

forming a second insulating layer over said horizontal and vertical wall surfaces of said first polysilicon and over the exposed second portion of said first insulating layer;

forming a conformal second polysilicon layer of a predetermined thickness over said second insulating layer;

anisotropically etching said conformal second polysilicon layer leaving a stud of said second polysilicon abutting said wall surface said stud having a submicron width defined by the thickness of said second polysilicon layer;

thermally oxidizing said submicron polysilicon stud to convert said polysilicon stud into silicon dioxide stud;

removing said first polysilicon layer to leave a submicron self-supporting oxide stud flanked on one side by said vertical wall surface; and anistropically etching said semiconductor material surrounding said self-supporting stud using said self-supporting stud as a mask whereby is formed a silicon semiconductor pedestal outwardly extending from and integral with said semiconductive material said pedestal having a submicron width defined by the width of said self-supporting oxide stud.

7. The process as recited in claim 6 wherein said step of forming a first insulating layer comprises forming a silicon dioxide-silicon nitride dual layer.

8. The process as recited in claim 6 wherein said step of forming a second insulating layer comprises:

forming a silicon nitride layer over said first polysilicon layer;

forming a silicon dioxide-silicon nitride dual layer over said wall; and forming a silicon nitride layer over said second portion of the first insulating layer.

9. The process as in claim 8 including forming a relatively thin silicon nitride layer on top of said first polysilicon layer and over said second portion of the first insulating layer, thermally oxidizing said polysilicon wall forming an oxide sidewall abutting said polysilicon wall and conformally forming said silicon nitride layers over the oxide sidewall and over said thin nitride layer.

* * * * *